(12) United States Patent
Fujii et al.

(10) Patent No.: US 10,037,886 B2
(45) Date of Patent: Jul. 31, 2018

(54) METHOD OF MANUFACTURING SILICON CARBIDE SEMICONDUCTOR DEVICE USING GRAPHENE AND HEXAGONAL BORON NITRIDE

(71) Applicant: FUJI ELECTRIC CO., LTD., Kawasaki-shi, Kanagawa (JP)

(72) Inventors: Takeshi Fujii, Hino (JP); Mariko Sato, Fujisawa (JP); Takuro Inamoto, Kawasaki (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/197,845

(22) Filed: Jun. 30, 2016

(65) Prior Publication Data

US 2016/0307756 A1    Oct. 20, 2016

Related U.S. Application Data

(63) Continuation of application No. PCT/JP2015/064974, filed on May 25, 2015.

(30) Foreign Application Priority Data

Jul. 2, 2014    (JP) ................. 2014-137244

(51) Int. Cl.
*H01L 29/16* (2006.01)
*H01L 21/04* (2006.01)
*H01L 29/45* (2006.01)

(52) U.S. Cl.
CPC ...... *H01L 21/0485* (2013.01); *H01L 29/1606* (2013.01); *H01L 29/45* (2013.01); *H01L 29/1608* (2013.01)

(58) Field of Classification Search
CPC ... H01L 29/452; H01L 29/454; H01L 29/475; H01L 29/435; H01L 21/28
See application file for complete search history.

(56) References Cited

U.S. PATENT DOCUMENTS 5,117,267 A    5/1992  Kimoto et al.
6,686,616 B1 *  2/2004  Allen .................. H01L 21/7605
                                              257/280

(Continued)

FOREIGN PATENT DOCUMENTS

CN    102290333 A    12/2011
CN    103117298 A    5/2013

(Continued)

OTHER PUBLICATIONS

Endo et al., "Manufacturing Method of Silicon Carbide Semiconductor Device", Translation Jan. 3, 2017,www.espacnet.com.*

(Continued)

*Primary Examiner* — Benjamin Sandvik
(74) *Attorney, Agent, or Firm* — Rabin & Berdo, P.C.

(57) ABSTRACT

A method of manufacturing a silicon carbide semiconductor device having a contact formed between a p-type silicon carbide semiconductor body and a metal electrode, includes forming on a surface of the p-type silicon carbide semiconductor body, a graphene layer so as to reduce a potential difference generated in a conjunction interface between the p-type silicon carbide semiconductor body and the metal electrode; forming an insulator layer comprising a hexagonal boron nitride on a surface of the graphene layer; and forming the metal electrode on a surface of the insulation layer.

6 Claims, 2 Drawing Sheets

(56) References Cited

U.S. PATENT DOCUMENTS

| | | | |
|---|---|---|---|
| 8,698,226 B2* | 4/2014 | Jain | H01L 29/1606 257/317 |
| 8,890,277 B2* | 11/2014 | Hebard | H01L 29/1606 257/29 |
| 2005/0127334 A1* | 6/2005 | Shibata | H01J 1/304 252/502 |
| 2012/0228631 A1 | 9/2012 | Kono et al. | |
| 2013/0230722 A1* | 9/2013 | Fujii | C01B 31/0438 428/408 |
| 2014/0162021 A1* | 6/2014 | Fujii | C01B 32/184 428/141 |
| 2016/0005881 A1* | 1/2016 | Fujii | H01L 51/0045 257/24 |
| 2017/0278930 A1* | 9/2017 | Ruhl | H01L 21/02529 |
| 2018/0047856 A1* | 2/2018 | Cai | H01L 31/028 |

FOREIGN PATENT DOCUMENTS

| | | | | |
|---|---|---|---|---|
| CN | 103400859 A | 11/2013 | | |
| JP | 2011-071281 A | 4/2011 | | |
| JP | 2011-096905 A | 5/2011 | | |
| JP | 2011096905 A * | 5/2011 | | |
| JP | 2012-190982 A | 10/2012 | | |
| JP | 2013-187420 A | 9/2013 | | |
| KR | 20130132808 A * | 12/2013 | | C01B 31/0438 |
| WO | WO 2013-121954 A1 | 8/2013 | | |

OTHER PUBLICATIONS

Takeaki Yajima et al., "Controlling Band Alignments by Engineering Interface Dipoles at Perovskite Oxide Heterointerfaces", Photon Factory News, High Energy Accelerator Research Organization, vol. 29, No. 4, pp. 13-16, Feb. 4, 2012.

M. J. Tadjer et al., "Vertical conduction mechanism of the epitaxial graphene/n-type 4H—SiC heterojunction at cryogenic temperatures", Applied Physics Letters, American Institute of Physics, vol. 100, No. 193506, pp. 193506-1-193506-4, May 10, 2012.

S. Hertel et al., "Tailoring the graphene/silicon carbide interface for monolithic wafer-scale electronics", Nature Communications, vol. 3, No. 957, pp. 1-6, Jul. 17, 2012.

* cited by examiner

FIG. 3

| | METAL ELECTRODE | GRAPHENE LAYERS | h-BN LAYERS | p-SiC CARRIER CONCENTRATION | I-V CHARACTERISTICS |
|---|---|---|---|---|---|
| EXAMPLE 1 | Au | 1 | NONE | $1 \times 10^{19}/cm^3$ | OHMIC |
| EXAMPLE 2 | Au | 2 | NONE | $1 \times 10^{19}/cm^3$ | OHMIC |
| EXAMPLE 3 | Au | 3 | NONE | $1 \times 10^{19}/cm^3$ | OHMIC |
| EXAMPLE 4 | Au | 1 | NONE | $1 \times 10^{18}/cm^3$ | OHMIC |
| EXAMPLE 5 | Au | 1 | NONE | $1 \times 10^{17}/cm^3$ | OHMIC |
| EXAMPLE 6 | Au | 1 | NONE | $1 \times 10^{16}/cm^3$ | OHMIC |
| EXAMPLE 7 | Ni | 1 | 1 | $1 \times 10^{19}/cm^3$ | OHMIC |
| EXAMPLE 8 | Ni | 1 | 2 | $1 \times 10^{19}/cm^3$ | OHMIC |
| EXAMPLE 9 | Ni | 1 | 1 | $1 \times 10^{18}/cm^3$ | OHMIC |
| EXAMPLE 10 | Ni | 1 | 1 | $1 \times 10^{17}/cm^3$ | OHMIC |
| EXAMPLE 11 | Ni | 1 | 1 | $1 \times 10^{16}/cm^3$ | OHMIC |
| EXAMPLE 12 | Au | 1 (30% COVERAGE) | NONE | $1 \times 10^{19}/cm^3$ | OHMIC |
| EXAMPLE 13 | Ni | 1 (30% COVERAGE) | 1 | $1 \times 10^{19}/cm^3$ | OHMIC |
| COMPARATIVE EXAMPLE 1 | Au | NONE | NONE | $1 \times 10^{19}/cm^3$ | SCHOTTKY |
| COMPARATIVE EXAMPLE 2 | Ni | 1 | NONE | $1 \times 10^{19}/cm^3$ | SCHOTTKY |

# METHOD OF MANUFACTURING SILICON CARBIDE SEMICONDUCTOR DEVICE USING GRAPHENE AND HEXAGONAL BORON NITRIDE

CROSS REFERENCE TO RELATED APPLICATIONS

This is a continuation application of International Application PCT/JP2015/064974 filed on May 25, 2015 which claims priority from a Japanese Patent Application No. 2014-137244 filed on Jul. 2, 2014, the contents of which are incorporated herein by reference.

BACKGROUND OF THE INVENTION

1. Field of the Invention

The embodiments of present invention discussed herein relate to a method of manufacturing a silicon carbide semiconductor device.

2. Description of the Related Art

A silicon carbide (SiC) semiconductor has a dielectric breakdown field strength about 10 times higher than conventional semiconductor materials such as a silicon (Si) semiconductor and a gallium arsenide (GaAs) semiconductor, and also has high thermal conductivity. Therefore, silicon carbide semiconductors have recently attracted attention as a semiconductor material enabling production (manufacturing) of a metal oxide semiconductor field effect transistor (MOSFET) for a power device enabling both maintenance of breakdown voltage and reductions in size.

In general, main contributors to energy loss during operation of a MOSFET include drift resistance (a resistance component of a drift layer), channel resistance (a resistance component of an inversion layer (channel) formed in a base region), and contact resistance (an electrical contact resistance component of a semiconductor device region and a metal electrode). Among these resistance components, contact resistance must be sufficiently reduced as compared to the drift resistance and the channel resistance. Even when a semiconductor device that employs a silicon carbide semiconductor (hereinafter, silicon carbide semiconductor device) is produced (manufactured), formation of an ohmic contact with a metal electrode poses a technical problem.

The ohmic contact between a silicon carbide semiconductor device region and a metal electrode is conventionally formed by using a method for forming a contact between a silicon semiconductor device region and a metal electrode to convert a metal film of nickel (Ni), titanium (Ti), etc. formed on a surface of the semiconductor device region into a silicide by annealing (heat treatment). For example, the contact resistance of an n-type silicon carbide semiconductor device region and a metal electrode obtained by this method is about $10^{-4}$ $\Omega cm^2$, which is sufficiently smaller as compared to the channel resistance. A method of forming a contact has also been disclosed with respect to a case of using, as a semiconductor material, strontium titanate (SrTiO$_3$) doped with niobium (Nb), which like a silicon carbide semiconductor, has a large bandgap of 3.2 eV.

In a proposed method of manufacturing a semiconductor device using Nb-doped SrTiO$_3$, a dipole is formed at a junction interface of an Nb-doped SrTiO$_3$ layer and a Strontium Ruthenate (SrRuO$_3$) film, which is a metal oxide film, by disposing at the junction interface, a lanthanum oxide (LaO) layer that is more positively charged than the SrO film, whereby a Schottky barrier is decreased (for example, refer to Yajima, T., et al, "Controlling Band Alignments by Engineering Interface Dipoles at Perovskite Oxide Heterointerfaces", Photon Factory News, High Energy Accelerator Research Organization, February 2012, Vol. 29, No. 4, pp. 13 to 16). In "Controlling Band Alignments by Engineering Interface Dipoles at Perovskite Oxide Heterointerfaces", Yajima, T., et al describe that characteristics of an interface of one (single-layer) semiconductor layer and a metal film can be controlled by a dipole formed at the interface. In other words, this is a method of control enabling interface characteristics that exceed the characteristics of a junction interface of a semiconductor device region and a metal electrode formed by simply depositing the metal electrode on the semiconductor device region.

In other proposed methods of manufacturing a silicon carbide semiconductor device, graphene (a sheet-like substance of carbon atoms bound into a hexagonal lattice pattern with a thickness of one carbon atom) is used for forming an electrode (for example, refer to Japanese Laid-Open Patent Publication Nos. 2012-190982, 2011-096905, and 2013-187420; Tadjer, M. J., et al, "Vertical conduction mechanism of the epitaxial graphene/n-type 4H-SiC heterojunction at cryogenic temperatures", Applied Physics Letters, USA, American Institute of Physics, 2012, Vol. 100, No. 193506; and Hertel, S., et al, "Tailoring the graphene/silicon carbide interface for monolithic wafer-scale electronics", Nature Communications, U.K., Macmillan Publishers, 2012.7.17, Vol. 3, No. 957). Japanese Laid-Open Patent Publication No. 2012-190982 (paragraphs 0023 to 0024 and 0037) discloses that graphene is used for a source electrode and a drain electrode of a silicon carbide MOSFET. In Japanese Laid-Open Patent Publication No. 2012-190982, a metal film or a carbon (C) film is deposited on a silicon carbide semiconductor device region and the silicon carbide semiconductor device region is reacted with the metal film or the carbon film by an anneal contact to form the source electrode and the drain electrode.

Japanese Laid-Open Patent Publication No. 2011-096905 discloses that a carbon (C) layer and a metal layer are deposited sequentially on a silicon carbide semiconductor device region and that the metal layer is caused to react with the silicon carbide semiconductor device region and the carbon layer by an anneal contact to form an ohmic contact having low contact resistance. Japanese Laid-Open Patent Publication No. 2013-187420 (paragraphs 0061 to 0068) discloses that a carbon layer and a tantalum (Ta) layer are formed sequentially on a C plane of a silicon carbide semiconductor substrate and that the carbon layer is caused to react with the tantalum layer by a heat treatment to form an ohmic contact of tantalum carbide (TaC). Japanese Laid-Open Patent Publication No. 2011-096905 (paragraph 0063) and Japanese Laid-Open Patent Publication No. 2013-187420 (paragraph 0071) disclose that graphene is used as the carbon layer.

SUMMARY OF THE INVENTION

However, a silicon carbide semiconductor has a bandgap (forbidden band) much larger than that of a silicon semiconductor and therefore, characteristics at a junction interface of a silicon carbide semiconductor device region and a metal electrode differ from those for a p-type and an n-type. In particular, in a silicon semiconductor, a metal is present that has a Fermi level close to an energy level at the top of a valence band. By using such a metal to form a metal electrode, a potential difference (Schottky barrier height) generated at a junction interface of the silicon semiconductor device region and the metal electrode can be substantially eliminated between the p-type and the n-type.

On the other hand, a silicon carbide semiconductor has an extremely deep energy level of 6.6 eV at the top of the valence band and even if platinum (Pt) having the highest work function (energy difference between a vacuum level and a Fermi level) is used as a metal electrode, a work function difference from the silicon carbide semiconductor is 1.2 eV or more. Therefore, if a metal electrode is simply disposed on a p-type silicon carbide semiconductor body in a usual manner, a high Schottky barrier is formed for holes in a junction interface of the p-type silicon carbide semiconductor body and the metal electrode, making it difficult to form an ohmic contact.

Even if the method of forming a contact between a silicon semiconductor device region and a metal electrode described above is further used for silicidation of a nickel film, a titanium film, etc. formed on a surface of the p-type silicon carbide semiconductor body, the contact resistance of the p-type silicon carbide semiconductor body and the metal electrode is a value of $10^{-2}$ $\Omega cm^2$ to $10^{-3}$ $\Omega cm^2$, an insufficient in practical terms. Moreover, the principle of ohmic contact formation by silicidation is not clear and formation by silicidation is poorly-reproducible. Therefore, application of a method of forming an ohmic contact by silicidation to form a contact between a p-type silicon carbide semiconductor and a metal electrode is currently a technical problem.

As described above, a root cause of increased contact resistance of a p-type silicon carbide semiconductor and a metal electrode arises from the energy level at the top of the valence band in the silicon carbide semiconductor being deep. Therefore, from the principle of Schottky barrier generation at a junction interface of a semiconductor device region and a metal electrode, it is presumed that a lower contact resistance of the p-type silicon carbide semiconductor body and the metal electrode is difficult to achieve through a method of forming a contact between a semiconductor device region and a metal electrode by simply depositing the metal electrode on the semiconductor device region.

In "Controlling Band Alignments by Engineering Interface Dipoles at Perovskite Oxide Heterointerfaces" (Yajima, T., et al), controlling an ionic valence of an oxide film ($SrRuO_3$ film) of ionic crystals (crystals formed by ionic bonds between atoms) is an important principle for controlling characteristics of a junction interface of the Nb-doped $SrTiO_3$ layer and the $SrRuO_3$ layer. However, the silicon carbide semiconductor of covalent crystals (crystals formed by covalent bonds between atoms) does not generate charge transfer to the extent that a dipole is easily formed at the junction interface of the silicon carbide semiconductor and the metal electrode even when elemental substitution is performed (the ionic valence of the silicon carbide semiconductor is controlled). Therefore, it is difficult to apply the method of forming a contact through elemental substitution as described by Yajima, T., et al, "Controlling Band Alignments by Engineering Interface Dipoles at Perovskite Oxide Heterointerfaces" to the formation of a contact of the silicon carbide semiconductor and the metal electrode.

According to one aspect of the present invention, a method of manufacturing a silicon carbide semiconductor device having an electrical contact formed between a p-type silicon carbide semiconductor body and a metal electrode, includes forming on a surface of the p-type silicon carbide semiconductor body, a graphene layer so as to reduce an electrical potential drop generated in a conjunction interface between the p-type silicon carbide semiconductor body and the metal electrode; forming an insulator layer comprising a hexagonal boron nitride on a surface of the graphene layer; and forming the metal electrode on a surface of the insulation layer.

In the method, the graphene layer is formed so as to be of one to three layers.

In the method, coverage of the graphene layer on the p-type silicon carbide semiconductor body is at least 30% of a surface area of the p-type silicon carbide semiconductor body.

In the method, the p-type silicon carbide semiconductor body has a carrier concentration of at least $1 \times 10^{16}/cm^3$.

In the method, the metal electrode includes at least one of gold, silver, platinum, titanium, nickel, iron, cobalt, copper, chromium, aluminum, palladium, and an alloy thereof.

In the method, the insulator layer is formed so as to be of one or two layers.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a chart of voltage-current characteristics of a silicon carbide semiconductor device according to the present invention.

DETAILED DESCRIPTION OF THE INVENTION

Figure 1:
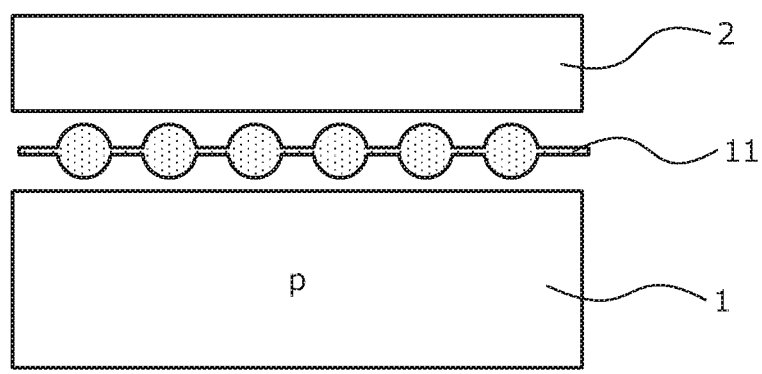
FIG. 1 is a cross-sectional view of a main portion of a structure of a silicon carbide semiconductor device according to a first embodiment.

Embodiments of a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described. Further, in the present description, when Miller indices are described, "−" means a bar added to an index immediately after the "−", and a negative index is expressed by prefixing "−" to the index.

<First Embodiment>

A cross-sectional structure of a semiconductor device formed of silicon carbide (SiC) (silicon carbide semiconductor device) according to a first embodiment will be described. FIG. 1 is a cross-sectional view of a main portion of a structure of the silicon carbide semiconductor device according to the first embodiment. FIG. 1 depicts an enlarged view of a vicinity of a metal electrode 2 disposed on a surface of a p-type silicon carbide semiconductor body 1 (similarly for FIG. 2). The p-type silicon carbide semiconductor body 1 is, for example, a semiconductor substrate formed of a p-type silicon carbide semiconductor (hereinafter, silicon carbide semiconductor substrate (semiconductor chip)), a p-type silicon carbide semiconductor layer or a pattern stacked on the silicon carbide semiconductor substrate, or a p-type silicon carbide semiconductor region disposed on a surface layer of the silicon carbide semiconductor substrate.

The p-type silicon carbide semiconductor body 1 may be comprised of a silicon carbide having a crystal structure of six-layer period hexagonal crystals (6H-SiC), four-layer period hexagonal crystals 4H-SiC), or three-layer period hexagonal crystals (3H-SiC) of silicon carbide. The surface of the p-type silicon carbide semiconductor body 1 is subjected to a surface planarization treatment to the extent that flatness is achieved at the atomic level, for example. On the planarized surface of the p-type silicon carbide semiconductor body 1, a layer (hereinafter a graphene layer) 11 of graphene (a sheet-like substance of carbon (C) atoms bound into a hexagonal lattice pattern with a thickness of one carbon atom), which is a semiconductor without a bandgap (dot-like hatched portions) is disposed. The p-type silicon carbide semiconductor body 1 may have a crystal plane orientation of, for example, a (0001) plane, a (000-1) plane, and a (11-20) plane, on the surface contacting the graphene layer 11.

Coverage of the graphene layer 11 on the p-type silicon carbide semiconductor body 1 (hereinafter, simply the coverage of the graphene layer 11), i.e., a surface area A1 of the graphene layer 11 relative to the surface area A0 of the p-type silicon carbide semiconductor body 1 (=A1/A0) may be 30% or more of the surface area of the p-type silicon carbide semiconductor body 1. The surface area A1 indicates an area of a surface area of the p-type silicon carbide semiconductor body 1 covered by the graphene layer 11. The surface area A1 indicates a total surface area of a surface of the p-type silicon carbide semiconductor body that faces the graphene layer 11. The p-type silicon carbide semiconductor body 1 may have a carrier concentration of $1\times10^{16}/CM^3$ or more, for example. The graphene layer 11 may have a single-layer structure made up of one layer of graphene or a stacked structure formed by stacking three or less layers of graphene, ensuring that a dipole is formed at a junction interface of the p-type silicon carbide semiconductor body 1 and the metal electrode 2. By forming the dipole at the junction interface of the p-type silicon carbide semiconductor body 1 and the metal electrode 2, a potential difference (Schottky barrier height) generated at the junction interface of the p-type silicon carbide semiconductor body 1 and the metal electrode 2 can be decreased.

The graphene layer 11 may have a single-layer structure since the single layer is the only structure having no gap and can facilitate movement of a Fermi level. FIG. 1 depicts the graphene layer 11 with the single-layer structure. Carbon atoms making up the graphene layer 11 are represented by a circular shape and a covalent bond of the carbon atoms is represented by a straight line shape connecting adjacent circular-shaped portions. Although the graphene layer 11 is depicted as being away from the p-type silicon carbide semiconductor body 1 and the metal electrode 2 for clarification of the junction interface positions of the p-type silicon carbide semiconductor body 1 to the graphene layer 11 and the metal electrode 2 in FIG. 1, the graphene layer 11 contacts both the p-type silicon carbide semiconductor body 1 and the metal electrode 2.

The metal electrode 2 is disposed on the graphene layer 11. The metal electrode 2 forms an ohmic contact with the p-type silicon carbide semiconductor body 1 through the graphene layer 11 disposed between the metal electrode 2 and the p-type silicon carbide semiconductor body 1. For example, the metal electrode 2 may be a surface electrode making up a typical device structure such as a source electrode and a drain electrode of a MOSFET, for example. An electrode material of the metal electrode 2 may be gold (Au), silver (Ag), platinum (Pt), titanium (Ti), nickel (Ni), iron (Fe), cobalt (Co), copper (Cu), chromium (Cr), aluminum (Al), palladium (Pd), or an alloy containing at least one of these metals. Alternatively, the metal electrode 2 may be a stacked film formed by stacking metal films containing one of or a combination of the metals and alloys described above.

A method of manufacturing a silicon carbide semiconductor device according to the first embodiment will be described with reference to FIG. 1. Although steps of forming device structures other than the graphene layer 11 and the metal electrode 2 will not be described, the device structures other than the graphene layer 11 and the metal electrode 2 may be formed by a general method at predetermined timing. First, for example, a semiconductor wafer of a p-type silicon carbide semiconductor (hereinafter, p-type SiC wafer) is prepared and has a diameter of 3 inches with both surfaces mirror-polished by a chemical mechanical polishing (CMP) treatment. The thickness of the p-type SiC wafer may be 430 μm, for example. A principal surface of the p-type SiC wafer may be a (0001) plane having an off-angle of about 4 to 8 degrees in a <11-20> direction, for example.

A p-type epitaxial layer is deposited (formed) on the principal surface of the p-type SiC wafer by a chemical vapor deposition (CVD) method. This p-type epitaxial layer may have a carrier concentration of $1\times10^{19}/cm^3$ and a thickness of 10 μm, for example. As a result, a p-type epitaxial wafer is formed by depositing the p-type epitaxial layer on the p-type SiC wafer. The p-type epitaxial wafer is diced into a chip shape at predetermined timing and, for example, a p-type semiconductor chip having a chip size of 10 mm (the p-type silicon carbide semiconductor body 1 and hereinafter, p-type semiconductor chip 1) is formed.

Subsequently, for example, chip surface modification is performed by UV ozone cleaning using ultra violet (UV) and ozone ($O_3$) and substances on the chip surface are removed by an organic cleaning treatment. The single-layer graphene layer 11 is grown (formed) by heat treating a front surface of the p-type semiconductor chip 1. For example, a method of forming the graphene layer 11 may be a method of heating the p-type semiconductor chip 1 to about 1200 degrees C., for example, to desorb silicon atoms from the silicon carbide semiconductor making up the p-type semiconductor chip 1 so as to form the graphene layer 11 from remaining carbon atoms.

The method of forming the graphene layer 11 may be a CVD method, a molecular beam epitaxy (MBE) method, and a method of transferring the preformed graphene layer 11 onto the p-type semiconductor chip 1. For example, when a method of heating the p-type semiconductor chip 1 to form the graphene layer 11 is used, the graphene layer 11 is formed as follows. First, the p-type semiconductor chip 1 is inserted into a reaction furnace (chamber) of an infrared condensing ultra-high temperature heating device. The reaction furnace is evacuated to about $6.6\times10^{-1}$ Pa, for example. For example, argon (Ar) gas is introduced into the reaction furnace until atmospheric pressure is reached and the argon (Ar) gas is allowed to continuously flow at a predetermined flow rate so that the p-type semiconductor chip 1 is exposed to an argon gas atmosphere.

After the temperature in the reaction furnace has been raised from room temperature (e.g., about 25 degrees C.) to about 1650 degrees C. (maximum temperature) at, for example, a heating rate (rate of temperature increase) of 20 degrees C./minute, the temperature in the reaction furnace is maintained at the maximum temperature for 5 minutes, for example. As a result, the single-layer graphene layer 11 is formed on the front surface of the p-type semiconductor chip 1. In the case of the graphene layer 11 with a stacked structure, the temperature in the reaction furnace may be maintained at the maximum temperature for a longer period after reaching the maximum temperature. After the temperature in the reaction furnace drops to the room temperature, the p-type semiconductor chip 1 is taken out from the reacting furnace. Subsequently, for example, a gold electrode is formed as the metal electrode 2 on the graphene layer 11 to complete the semiconductor device having the graphene layer 11 and the metal electrode 2 formed sequentially on the p-type semiconductor chip 1 depicted in FIG. 1.

The metal electrode 2 may be formed by a vapor deposition method and an MBE method, for example. On the other hand, when the metal electrode 2 is formed by a film deposition (formation) method using target atoms (molecules) having high kinetic energy such as a sputtering method, the graphene layer 11, etc. may be destroyed during formation of the metal electrode 2 and therefore, the method is not preferable. Although the method of manufacturing a silicon carbide semiconductor device according to the first embodiment has been described by taking, as an example, a case of forming the graphene layers 11 and the metal electrodes 2 on the p-type semiconductor chips 1 after dicing, the p-type epitaxial wafer may be diced after forming the graphene layer 11 and the metal electrode 2 on the p-type epitaxial wafer.

As described above, according to the first embodiment, the dipole can be formed at the junction interface of the p-type silicon carbide semiconductor body and the metal electrode by inserting the graphene layer at the junction interface of the p-type silicon carbide semiconductor body and the metal electrode. As a result, a potential difference (Schottky barrier height) generated at the junction interface of the p-type silicon carbide semiconductor body and the metal electrode can be reduced and a low-resistance ohmic contact can be formed at the junction interface of the p-type silicon carbide semiconductor body and the metal electrode, with high reproducibility.

<Second Embodiment>

Figure 2:
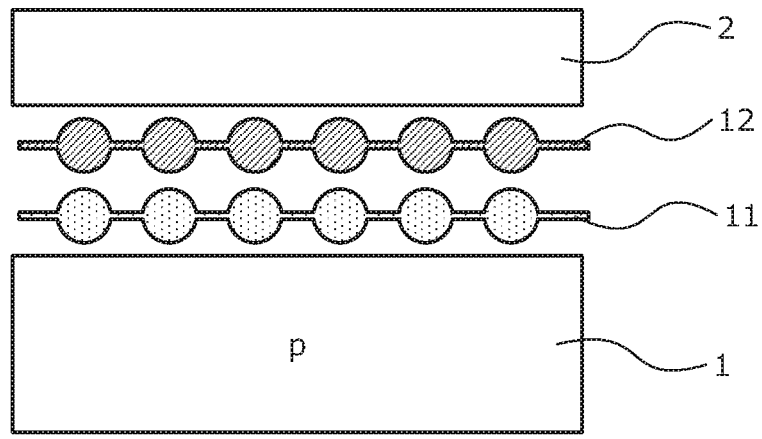
FIG. 2 is a cross-sectional view of a main portion of a structure of the silicon carbide semiconductor device according to a second embodiment.

A cross-sectional structure of a silicon carbide semiconductor device according to a second embodiment will be described. FIG. 2 is a cross-sectional view of a main portion of a structure of the silicon carbide semiconductor device according to the second embodiment. The silicon carbide semiconductor device according to the second embodiment differs from the silicon carbide semiconductor device according to the first embodiment in that a layer of hexagonal boron nitride (h-BN) (hereinafter, h-BM layer) 12 used as an insulator is disposed between the graphene layer 11 and the metal electrode 2. The h-BM layer 12 may have a single-layer structure or a stacked structure. The h-BM layer 12 has a function of preventing the graphene layer 11 and the metal electrode 2 from interacting with each other in an adverse way.

For example, nickel may be used as an electrode material of the metal electrode 2 and is known to strongly interact with the graphene layer 11. As a result, the energy band of the graphene layer 11 is modulated and charge transfer for forming an ohmic contact of the p-type silicon carbide semiconductor body 1 and the metal electrode 2 is difficult to achieve between the p-type silicon carbide semiconductor body 1 and the metal electrode 2. Therefore, the h-BM layer 12 is formed between the graphene layer 11 and the metal electrode 2 to block the interaction between the graphene layer 11 and the metal electrode 2 by the h-BM layer 12.

In a method of manufacturing a silicon carbide semiconductor device according to the second embodiment, the h-BM layer 12 may be formed directly by an MBE method or a CVD method after forming the graphene layer 11 or, for example, the single-layer h-BM layer 12 may be formed on the graphene layer 11 after formation of the graphene layer 11 and before formation of the metal electrode 2, in the method of manufacturing a silicon carbide semiconductor device according to the first embodiment. The h-BM layer 12 may be formed by, for example, a CVD method, an MBE method, and a method of transferring the preformed h-BM layer 12 onto the graphene layer 11. For example, first, as in the first embodiment, a p-type SiC wafer with both surfaces mirror-polished by a chemical mechanical polishing treatment is prepared and the processes are performed sequentially through formation of the graphene layer 11. Subsequently, for example, the single-layer h-BM layer 12 is formed on the graphene layer 11.

For example, when the h-BM layer 12 is transferred onto the graphene layer 11 on the p-type semiconductor chip 1 (the p-type silicon carbide semiconductor body 1) having a chip size of 10 mm, the film-shaped h-BM layer 12 to be transferred onto the graphene layer 11 may be formed as follows. First, a 10-mm square sheet of chemically-mechanically polished copper foil having a thickness of 100 µm, for example, is prepared as a supporting substrate for forming the film-shaped h-BM layer 12. This copper foil may have an average surface roughness of 1 nm, for example. The copper foil is inserted into a reaction furnace of a CVD apparatus. The reaction furnace is evacuated to about $1 \times 10^{-3}$ Pa, for example.

For example, hydrogen ($H_2$) gas is introduced until the pressure inside the reaction furnace reaches about 6.6 Pa ($=5 \times 10^{-2}$ Torr), for example, and is allowed to continuously flow at a predetermined flow rate so that the p-type semiconductor chip 1 is exposed to a hydrogen gas atmosphere. The temperature inside the reaction furnace is then raised from room temperature to about 1000 degrees C. at a heating rate of 50 degrees C./minute, for example. While the temperature inside the reaction furnace is maintained at about 1000 degrees C., the introduction of the hydrogen gas into the reaction furnace is stopped. Argon gas is then introduced into the reaction furnace and is allowed to continuously flow at a predetermined flow rate so that the p-type semiconductor chip 1 is exposed to an argon gas atmosphere. Ammonia borane ($H_3NBH_3$) as a raw material source of the h-BM layer 12 is sublimated in a flow path of the argon gas to use the argon gas as a carrier gas so that ammonia borane is introduced into the reaction furnace to about 666 Pa (about 5 Torr), for example. The temperature of the copper foil and the gas pressure is maintained for 10 minutes, whereby the single-layer h-BM layer 12 is formed on the copper foil.

In the case of the h-BM layer 12 with a stacked structure, the temperature (the temperature of the copper foil) and the gas pressure in the reaction furnace may be maintained for a longer period after the source gas is introduced into the reaction furnace. The temperature in the reaction furnace is then rapidly reduced at a cooling rate (cooling speed) of 100 degrees C./second. The copper foil on which the h-BM layer 12 is formed is removed from the reaction furnace. Subsequently, for example, an acrylic resin film such as a polymethyl methacrylate (PMMA) film (not depicted) is formed on the h-BM layer 12. The PMMA film may be formed by, for example, dropping about 20 µl of a PMMA solution obtained by dissolving PMMA at the proportion of 10 wt % in dichlorobenzene onto the h-BM layer 12 for spin coating under conditions of 4000 rpm for 60 seconds followed by drying at a temperature of about 40 degrees C. for 30 minutes.

The copper foil is then removed by etching. For example, the copper foil is immersed in, for example, a liquid mixture of 10 ml of hydrochloric acid (HCl), 10 ml of hydrogen peroxide ($H_2O_2$), and 50 ml of pure water until the copper foil on which the h-BM layer 12 and the PMMA film are formed completely disappears. For example, after cleaning with flowing water for 5 minutes, the film-shaped h-BM layer 12 supported by the PMMA film is formed by drying. After the copper foil is removed, the h-BM layer 12 is supported by the acrylic resin film such as the PMMA film. The h-BM layer 12 supported by the PMMA film is pressed against the graphene layer 11 on the p-type semiconductor chip 1. The h-BM layer 12 is then pressure bonded to the graphene layer 11 at the pressure of 49 KPa while being heated at the temperature of 80 degrees C., for example.

Subsequently, for example, the PMMA film is softened by a heat treatment at the temperature of 180 degrees C. for 30 minutes and the h-BM layer 12 is made to contact the graphene layer 11. The p-type semiconductor chip 1 on which the h-BM layer 12 has been made to contact the graphene layer 11 is immersed in, for example, acetone ($CH_3COCH_3$), for 5 minutes to dissolve the PMMA film. The entire p-type semiconductor chip 1 on which the graphene layer 11 and the h-BM layer 12 are formed is cleaned with ultrapure water for about 5 minutes. As a result, the h-BM layer 12 is transferred onto the graphene layer 11. Subsequently, the metal electrode 2 is formed on the h-BM layer 12 to complete the semiconductor device having the graphene layer 11, the h-BM layer 12, and the metal electrode 2 sequentially formed on the p-type semiconductor chip 1 depicted in FIG. 2. The method of forming the metal electrode 2 is the same as in the first embodiment.

As described above, according to the second embodiment, effects identical to those of the first embodiment can be achieved. According to the second embodiment, the h-BM layer is formed between the graphene layer and the metal electrode to block the interaction between the graphene layer and the metal electrode by the h-BM layer and the energy band of the graphene layer can thereby be prevented from being modulated. Thus, even when metal strongly interacting with the graphene layer is used as the electrode material of the metal electrode, the ohmic contact of the p-type silicon carbide semiconductor body and the metal electrode can be formed.

EXAMPLES

Voltage-current characteristics (I-V characteristics) of the semiconductor device according to the present invention were verified. FIG. 3 is a chart of the voltage-current characteristics of the silicon carbide semiconductor device according to the present invention. The methods of manufacturing the silicon carbide semiconductor devices according to the first and second embodiments, materials exemplified in Examples 1 to 13 described later, a usage amount and a mixture ratio of the materials, process details, process procedures, orientation and specific arrangement of processing apparatuses (elements and members), etc. are examples and can variously be modified without departing from the spirit of the present invention. Therefore, the present invention is not limited to the range of Examples 1 to 13 below.

First, seven samples were produced according to the method of manufacturing a silicon carbide semiconductor device according to the first embodiment described above (hereinafter, Examples 1 to 6, 12).

Examples 1 to 6, 12 differ in one or more of the stacking number of the graphene layer 11, the coverage of the graphene layer 11, and the carrier concentration of the p-type semiconductor chip 1 (p-type epitaxial layer) (described as p-SiC carrier concentration in FIG. 3). In Example 1, the graphene layer 11 with the single layer structure was formed on the p-type semiconductor chip 1 having a carrier concentration of $1 \times 10^{19}/cm^3$, under the conditions described in the method of manufacturing a silicon carbide semiconductor device according to the first embodiment described above. Subsequently, a metal mask having a 100-µm diameter pad pattern was disposed on the graphene layer 11 to stack a 500-nm-thick gold electrode as the metal electrode 2 by an electron beam (EB) vapor deposition method.

In Example 2, the time of maintaining the maximum temperature in the reaction furnace of the infrared condensing ultra-high temperature heating device was set to 10 minutes to form the graphene layer 11 with a two-layer structure. The method of manufacturing in Example 2 was the same as Example 1 except for the time of maintaining the maximum temperature in the reaction furnace of the infrared condensing ultra-high temperature heating device. In Example 3, the time of maintaining the maximum temperature in the reaction furnace of the infrared condensing ultra-high temperature heating device was set to 30 minutes to form the graphene layer 11 with a three-layer structure. The method of manufacturing in Example 3 was the same as Example 1 except for the time of maintaining the maximum temperature in the reaction furnace of the infrared condensing ultra-high temperature heating device.

In Example 4, the carrier concentration of the p-type semiconductor chip 1 was $1 \times 10^{18}/cm^3$. The method of manufacturing in Example 4 was the same as Example 1 except for the carrier concentration of the p-type semiconductor chip 1. In Example 5, the carrier concentration of the p-type semiconductor chip 1 was $1 \times 10^{17}/cm^3$. The method of manufacturing in Example 5 was the same as Example 1 except for the carrier concentration of the p-type semiconductor chip 1. In Example 6, the carrier concentration of the p-type semiconductor chip 1 was $1 \times 10^{16}/cm^3$. The method of manufacturing in Example 6 was the same as Example 1 except for the carrier concentration of the p-type semiconductor chip 1. In Example 12, the time of maintaining the maximum temperature in the reaction furnace of the infrared condensing ultra-high temperature heating device was set to 2 minutes to form the single-layer graphene layer 11 and the coverage of the graphene layer 11 was 30%. The method of manufacturing in Example 12 was the same as Example 1 except for the coverage of the graphene layer 11.

Six samples were produced according to the method of manufacturing a silicon carbide semiconductor device according to the second embodiment described above (hereinafter, Examples 7 to 11, 13). Examples 7 to 11, 13 differ in one or more of the coverage of the graphene layer 11, the stacking number of the h-BN layer 12, and the carrier concentration of the p-type semiconductor chip 1. In Example 7, the single-layer h-BN layer 12 was formed under the conditions exemplified in the method of manufacturing a silicon carbide semiconductor device according to the second embodiment described above and was transferred onto the graphene layer 11. The electrode material of the metal electrode 2 was nickel. The method of manufacturing in Example 7 was the same as Example 1 except that the h-BN layer 12 was formed and that the electrode material of the metal electrode 2 was changed to nickel.

In Example 8, after the source gas was introduced into the reaction furnace, the time of maintaining the temperature and the gas pressure in the reaction furnace was set to 30 minutes to form the h-BN layer 12 with a two-layer structure. The method of manufacturing in Example 8 was the same as Example 7 except for the time of maintaining the temperature and the gas pressure in the reaction furnace. In Example 9, the carrier concentration of the p-type semiconductor chip 1 was $1 \times 10^{18}/cm^3$. The method of manufacturing in Example 9 was the same as Example 7 except for the carrier concentration of the p-type semiconductor chip 1. In Example 10, the carrier concentration of the p-type semiconductor chip 1 was $1 \times 10^{17}/cm^3$. The method of manufacturing in Example 10 was the same as Example 7 except for the carrier concentration of the p-type semiconductor chip 1.

In Example 11, the carrier concentration of the p-type semiconductor chip 1 was $1 \times 10^{16}/cm^3$. The method of manufacturing in Example 11 was the same as Example 7 except for the carrier concentration of the p-type semiconductor chip 1. In Example 13, the time of maintaining the maximum temperature in the reaction furnace of the infrared condensing ultra-high temperature heating device was set to 2 minutes to form the single-layer graphene layer 11 and the coverage of the graphene layer 11 was 30%. The method of manufacturing in Example 13 was the same as Example 7 except for the coverage of the graphene layer 11.

For comparison, a sample was produced such that a gold electrode was directly formed as the metal electrode 2 on the p-type semiconductor chip 1 without forming the graphene layer 11 (hereinafter, Comparative Example 1). The method of manufacturing in Comparative Example 1 was the same as Example 1 except that the graphene layer 11 was not formed. Additionally, a sample (hereinafter, Comparative Example 2) was produced such that a nickel layer was directly formed as the metal electrode 2 on the graphene layer 11 without forming (transferring) the h-BM layer 12. The method of manufacturing in Comparative Example 2 was the same as Example 7 except that the h-BN layer 12 was not formed.

FIG. 3 depicts measurement results of I-V characteristics of Examples 1 to 13 and Comparative Example 1, 2 (I-V characteristics at the contact between the p-type semiconductor chip 1 and the metal electrode 2). It was confirmed that in all the samples produced as Examples 1 to 3 having the graphene layer 11 formed in the single-layer structure and the graphene layer 11 formed in the two- or three-layer structure, the I-V characteristics exhibit an ohmic property (an ohmic contact is formed between the p-type semiconductor chip 1 and the metal electrode 2 due to the graphene layer 11), resulting in a lower contact resistance. It was confirmed that in all the samples produced as Examples 1, 4 to 6 having the carrier concentration of the p-type semiconductor chip 1 varied in a range from $1 \times 10^{16}/cm^3$ to $1 \times 10^{19}/cm^3$, the I-V characteristics exhibit an ohmic property, resulting in a lower contact resistance.

On the other hand, it was confirmed that in Comparative Example 1 without the graphene layer 11 formed between the p-type semiconductor chip 1 and the metal electrode 2, the I-V characteristics exhibit a Schottky property (a Schottky contact is formed between the p-type semiconductor chip 1 and the metal electrode 2 due to the graphene layer 11), resulting in higher contact resistance. It was confirmed that in Comparative Example 2 having the nickel layer, which strongly interacts with the graphene layer 11, formed as the metal electrode 2 on the graphene layer 11, the I-V characteristics exhibit a Schottky property, resulting in higher contact resistance. Therefore, as a result of forming the h-BN layer 12 with the single- or two-layer structure between the graphene layer 11 and the metal electrode 2, it was confirmed that the I-V characteristics exhibit an ohmic property in both Examples 7 and 8, resulting in a lower contact resistance.

It was confirmed that in all the samples produced as Examples 7, 9 to 11 having the h-BN layer 12 formed between the graphene layer 11 and the metal electrode 2 and for which the carrier concentration of the p-type semiconductor chip 1 was varied in a range from $1 \times 10^{16}/cm^3$ to $1 \times 10^{19}/cm^3$, the I-V characteristics exhibit the ohmic property, resulting in a lower contact resistance. It was confirmed that in the sample produced as Example 12 having the single-layer graphene layer 11 formed at the coverage of 30% and provided with the gold electrode (the metal electrode 2), the I-V characteristics exhibit the ohmic property, resulting in a lower contact resistance. It was confirmed that in the sample produced as Example 13 having the single-layer graphene layer 11 formed at the coverage of 30% and the h-BN layer 12 formed on the graphene layer 11 and provided with the nickel electrode (the metal electrode 2), the I-V characteristics exhibit the ohmic property, resulting in a lower contact resistance. From the above results, it was verified that the present invention can implement a lower contact resistance.

The present invention can be modified variously without departing from the spirit of the present invention and, in the embodiments described above, for example, the dimensions, the impurity concentrations, etc. of the portions are variously set corresponding to required specifications, etc. The embodiments and Examples described above are merely examples and the effects of the present invention are produced by modifications obtained by combining the embodiments and Examples described above with other configurations without departing from the spirit of the present invention. For example, the present invention is applicable to semiconductor devices forming an ohmic contact of a p-type silicon carbide semiconductor body and a metal electrode, such as MOSFETs and insulated gate bipolar transistors (IGBTs), for example.

As a result of intensive studies to solve the problems described above and achieve an object, the present inventors found that a dipole is formed at a junction interface of a silicon carbide semiconductor device region and a metal electrode by disposing a graphene layer between the silicon carbide semiconductor device region and the metal electrode. Graphene is a semiconductor without a bandgap and has a Fermi level easily changed by charge transfer from a material layer contacting a graphene layer. By using this principle, electrons move from the graphene layer formed on a p-type silicon carbide semiconductor body to the p-type silicon carbide semiconductor body and it appears that positive charges (holes) effectively move from the p-type silicon carbide semiconductor body to the graphene layer. A graphene layer is widely known to be formed on a silicon carbide semiconductor device region by carbon atoms that remain consequent to heating the silicon carbide semiconductor device region at high temperature to vaporize silicon atoms. The present invention was conceived based on such knowledge.

According to the method of manufacturing a silicon carbide semiconductor device of the present invention, a dipole can be formed at a junction interface of a p-type silicon carbide semiconductor body and a metal electrode so as to reduce a potential difference generated at the junction interface. As a result, the method achieves an effect in that a low-resistance ohmic contact of the p-type silicon carbide semiconductor body and the metal electrode can be formed with high reproducibility.

As described above, the method of manufacturing a silicon carbide semiconductor device according to the present invention is useful for silicon carbide semiconductor devices having an ohmic contact between a p-type silicon carbide semiconductor and metal.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device including a p-type silicon carbide semiconductor body and a metal electrode, the method comprising:
   forming on a surface of the p-type silicon carbide semiconductor body, a graphene layer so as to reduce an electrical potential drop generated in a conjunction interface between the p-type silicon carbide semiconductor body and the metal electrode, the grapheme layer being in contact with the surface of the p-type silicon carbide semiconductor body;
   forming an insulator layer comprising a hexagonal boron nitride on a surface of the graphene layer; and
   forming, on a surface of the insulator layer, the metal electrode, the metal electrode being in ohmic contact with the p-type silicon carbide semiconductor body.

2. The method of manufacturing a silicon carbide semiconductor device according to claim 1, wherein the forming a graphene layer includes forming a laminated layer including one to three graphene laminated layers.

3. The method of manufacturing a silicon carbide semiconductor device according to claim 1, wherein the forming a graphene layer includes forming the graphene layer on the p-type silicon carbide semiconductor body so that coverage of the graphene layer that is a ratio of an area of a surface area of the p-type silicon carbide semiconductor body covered by the graphene layer to a total surface area of the p-type silicon carbide semiconductor body is equal to or greater than 30% of a surface area of the p-type silicon carbide semiconductor body.

4. The method of manufacturing a silicon carbide semiconductor device according to claim 1, wherein the p-type silicon carbide semiconductor body include a carrier concentration that is equal to or greater than $1 \times 10^{16}/cm^3$.

5. The method of manufacturing a silicon carbide semiconductor device according to claim 1, wherein the metal electrode comprised of one or more material selected from a group consisting of gold, silver, platinum, titanium, nickel, iron, cobalt, copper, chromium, aluminum, palladium, and an alloy thereof.

6. The method of manufacturing a silicon carbide semiconductor device according to claim 1, wherein the forming an insulator layer includes forming one insulator layer or two laminated insulator layers.

* * * * *